United States Patent
Yamaguchi (10) Patent No.: US 11,791,196 B2
(45) Date of Patent: Oct. 17, 2023

(54) PROCESSING APPARATUS

(71) Applicant: DISCO CORPORATION, Tokyo (JP)

(72) Inventor: Yoshitaka Yamaguchi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 202 days.

(21) Appl. No.: 16/874,806

(22) Filed: May 15, 2020

(65) Prior Publication Data

US 2020/0381288 A1    Dec. 3, 2020

(30) Foreign Application Priority Data

Jun. 3, 2019  (JP) ................. 2019-103460

(51) Int. Cl.
H01L 21/687     (2006.01)
H01L 21/67      (2006.01)
H01L 21/683     (2006.01)

(52) U.S. Cl.
CPC .. H01L 21/68764 (2013.01); H01L 21/67092 (2013.01); H01L 21/6838 (2013.01); *H01L 21/68728* (2013.01)

(58) Field of Classification Search
CPC .......... H01L 21/6838; H01L 21/67092; H01L 21/68764
See application file for complete search history.

(56) References Cited

U.S. PATENT DOCUMENTS 9,381,673 B2 *  7/2016  Gadd .................. B28D 5/0076
9,925,618 B2 *  3/2018  Maeda ................ B23K 26/032
9,975,202 B2 *  5/2018  Yamamoto ......... B23K 26/0006
9,981,339 B2 *  5/2018  Hirata ................. B23K 26/53
2018/0065187 A1 * 3/2018  Yamamoto ......... H01L 21/6838

FOREIGN PATENT DOCUMENTS

JP    2012-146723 A    8/2012
JP    2015162555 A     9/2015
JP    2019-046891 A    3/2019

OTHER PUBLICATIONS

Office Action issued by the German Patent Office for counterpart German Application No. 10 2020 206 848.8, dated Aug. 3, 2023.

* cited by examiner

*Primary Examiner* — Saul Rodriguez
*Assistant Examiner* — Willie W Berry, Jr.
(74) *Attorney, Agent, or Firm* — GREER BURNS & CRAIN, LTD.

(57) ABSTRACT

A processing apparatus includes a holding unit holding a workpiece, a processing unit processing the workpiece held by the holding unit, a feeding mechanism for feeding the holding unit, and a control unit controlling the feeding mechanism. The holding unit has a chuck table for holding the workpiece and a base for detachably supporting the chuck table. The chuck table includes a plurality of kinds of chuck tables, one of which being selected according to the size or shape of the workpiece. The base is capable of mounting the chuck table selected from the plural kinds of chuck tables. The control unit functions to set feeding conditions including acceleration of the feeding mechanism according to the kind of the chuck table mounted on the base and to control the feeding mechanism under the feeding conditions according to the chuck table.

8 Claims, 5 Drawing Sheets

PROCESSING APPARATUS

BACKGROUND OF THE INVENTION

Field of the Invention

The present invention relates to a processing apparatus including a holding unit holding a workpiece, a processing unit processing the workpiece held by the holding unit, and a feeding mechanism for feeding the holding unit.

Description of the Related Art

A plurality of devices such as integrated circuits (ICs) and large-scale integrations (LSIs) are formed on the front side of a wafer so as to be separated by a plurality of division lines. The wafer thus holding the plural devices on the front side is divided along the division lines by a dicing apparatus, thereby obtaining a plurality of individual device chips. These device chips are used in various kinds of electrical equipment such as mobile phones and personal computers.

The dicing apparatus includes a holding unit holding the wafer, a cutting unit having a rotatable cutting blade for cutting the wafer held by the holding unit, and a feeding mechanism for feeding the holding unit, whereby the wafer can be divided into the individual device chips.

The holding unit has a chuck table for holding the wafer and a base for detachably supporting the chuck table. The chuck table includes a plurality of kinds of chuck tables, one of which being selected according to the size of the wafer. The base is capable of mounting the chuck table selected from the plural kinds of chuck tables (refer to Japanese Patent Laid-open No. 2015-162555, for example).

SUMMARY OF THE INVENTION

In the case that the chuck table selected from the plural kinds of chuck tables can be mounted on the base as mentioned above, an inertial force (load) on the feeding mechanism in moving the chuck table of the holding unit at a constant acceleration is dependent upon the size of the chuck table. That is, when the chuck table having a largest size, or a largest weight, is selected and mounted on the base, the inertial force becomes maximum. Accordingly, feeding conditions (acceleration and uniform speed) in controlling the feeding mechanism are previously set so that even when the chuck table having a largest weight is selected, no excess load is applied to the feeding mechanism.

However, in the case that the feeding mechanism is controlled under the feeding conditions set so as to support the chuck table having a largest weight, the following problem may arise. When the chuck table having a smaller size, or a smaller weight, is selected, the load on the feeding mechanism in moving the holding unit becomes smaller. Accordingly, the holding unit is moved at a limited acceleration in spite of the smaller load, so that the productivity is reduced. Such a problem may arise also in processing a package substrate including a chip size (or scale) package (CSP) substrate. That is, in a processing apparatus for dividing the package substrate into individual chips, a holding unit (holding jig) for holding the package substrate is replaced according to the size or shape of the package substrate.

It is therefore an object of the present invention to provide a processing apparatus including a base capable of mounting a chuck table selected from plural kinds of chuck tables according to the size or shape of a workpiece, in which the productivity can be improved.

In accordance with an aspect of the present invention, there is provided a processing apparatus including a holding unit holding a workpiece, a processing unit processing the workpiece held by the holding unit, a feeding mechanism for feeding the holding unit, and a control unit controlling the feeding mechanism, in which the holding unit has a chuck table for holding the workpiece and a base for detachably supporting the chuck table, the chuck table includes a plurality of kinds of chuck tables, one of which being selected according to the size or shape of the workpiece, the base being capable of mounting the chuck table selected from the plurality of kinds of chuck tables, and after the chuck table mounted on the base is selected, the control unit sets feeding conditions including acceleration of the feeding mechanism according to the kind of the chuck table mounted on the base and controls the feeding mechanism under the feeding conditions according to the chuck table.

Preferably, the base of the holding unit is provided with a rotational drive portion for rotating the chuck table, and after the chuck table mounted on the base is selected, the control unit sets rotating conditions including a rotational acceleration of the rotational drive portion according to the kind of the chuck table mounted on the base and controls the rotational drive portion under the rotating conditions according to the chuck table.

Preferably, the control unit sets a frequency for controlling a drive source constituting the feeding mechanism and produces the acceleration included in the feeding conditions by setting an allowable time period from the time of starting the operation of the drive source to the time the frequency set above reaches a target frequency, according to the kind of the chuck table. Furthermore, the control unit sets a frequency for controlling a rotational drive source constituting the rotational drive portion and produces the rotational acceleration included in the rotating conditions by setting an allowable time period from the time of starting the operation of the rotational drive source to the time the frequency set above reaches a target frequency, according to the kind of the chuck table.

The processing apparatus according to the present invention can control the feeding mechanism under the feeding conditions including a suitable acceleration according to the size or shape of the chuck table. Accordingly, excess load on the feeding mechanism can be prevented and the productivity can also be improved.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the processing apparatus according to the present invention will now be described in detail with reference to the attached drawings.

Figure 1:
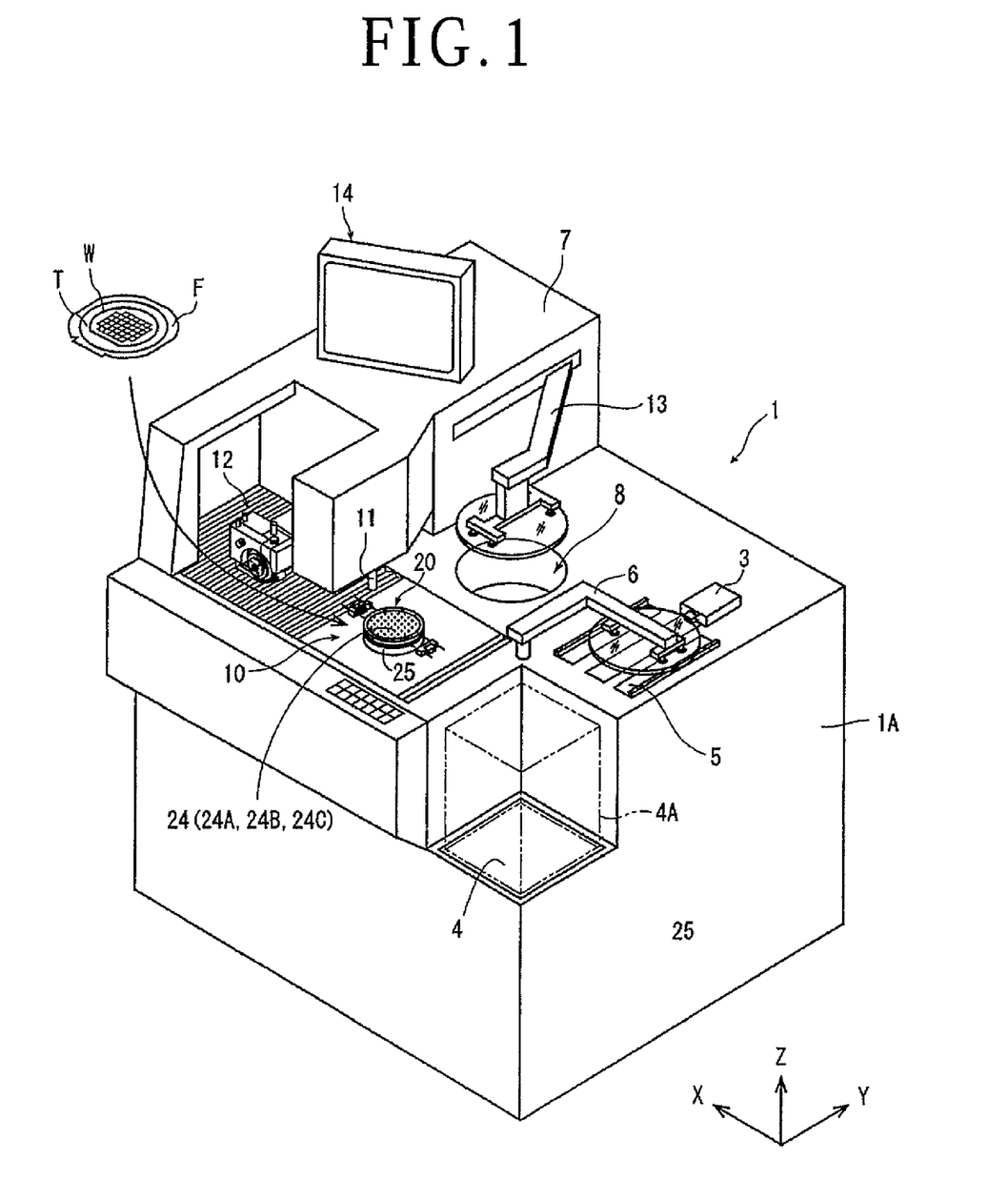
FIG. 1 is a general perspective view of a dicing apparatus.

FIG. 1 is a general perspective view of a dicing apparatus 1 as the processing apparatus according to this preferred embodiment. The configuration of the dicing apparatus 1 will now be described with reference to FIG. 1. In FIG. 1, reference symbol W denotes a wafer as a workpiece to be processed by the dicing apparatus 1. A plurality of devices are formed on the wafer W so as to be separated by a plurality of crossing division lines. The wafer W is supported through an adhesive tape T to a ring frame F.

As depicted in FIG. 1, the dicing apparatus 1 includes a housing 1A having a shape like a rectangular prism. The housing 1A has a vertically movable cassette mounting table 4 at a front corner portion. A cassette 4A is adapted to be mounted on the cassette mounting table 4. A plurality of wafers W are stored in the cassette 4A, in which each wafer W is supported through the adhesive tape T to the ring frame F. A temporary setting table 5 is provided on the upper surface of the housing 1A at a position behind the cassette 4A mounted on the cassette mounting table 4. One of the plural wafers W is taken out of the cassette 4A and carried to the temporary setting table 5 by a handling mechanism 3. The wafer W temporarily set on the temporary setting table 5 is transferred to a table mechanism 10 by a first transfer mechanism 6 having a swing arm rotatable about a vertical axis. The table mechanism 10 includes a holding unit 20 having a chuck table 24 (24A, 24B, or 24C) for holding the wafer W. An alignment unit 11 having an imaging unit (camera) is provided above a path of movement of the holding unit 20 in the X direction depicted by an arrow X. A cutting unit 12 as a processing unit processing the wafer W held on the chuck table 24 of the holding unit 20 is provided adjacent to the alignment unit 11 in the X direction. The cutting unit 12 has a cutting blade for cutting the wafer W held on the chuck table 24. A display unit 14 is provided on the upper surface of a raised portion 7 of the housing 1A. The display unit 14 has a display function for displaying a processing condition and also has a touch panel function for allowing an operator to set feeding conditions or the like to be hereinafter described. Further, a cleaning unit 8 for cleaning the wafer W after cutting is provided behind the chuck table 24 in its standby position depicted in FIG. 1. The wafer W is transferred from the chuck table 24 to the cleaning unit 8 by a second transfer mechanism 13 after cutting.

Figure 2:
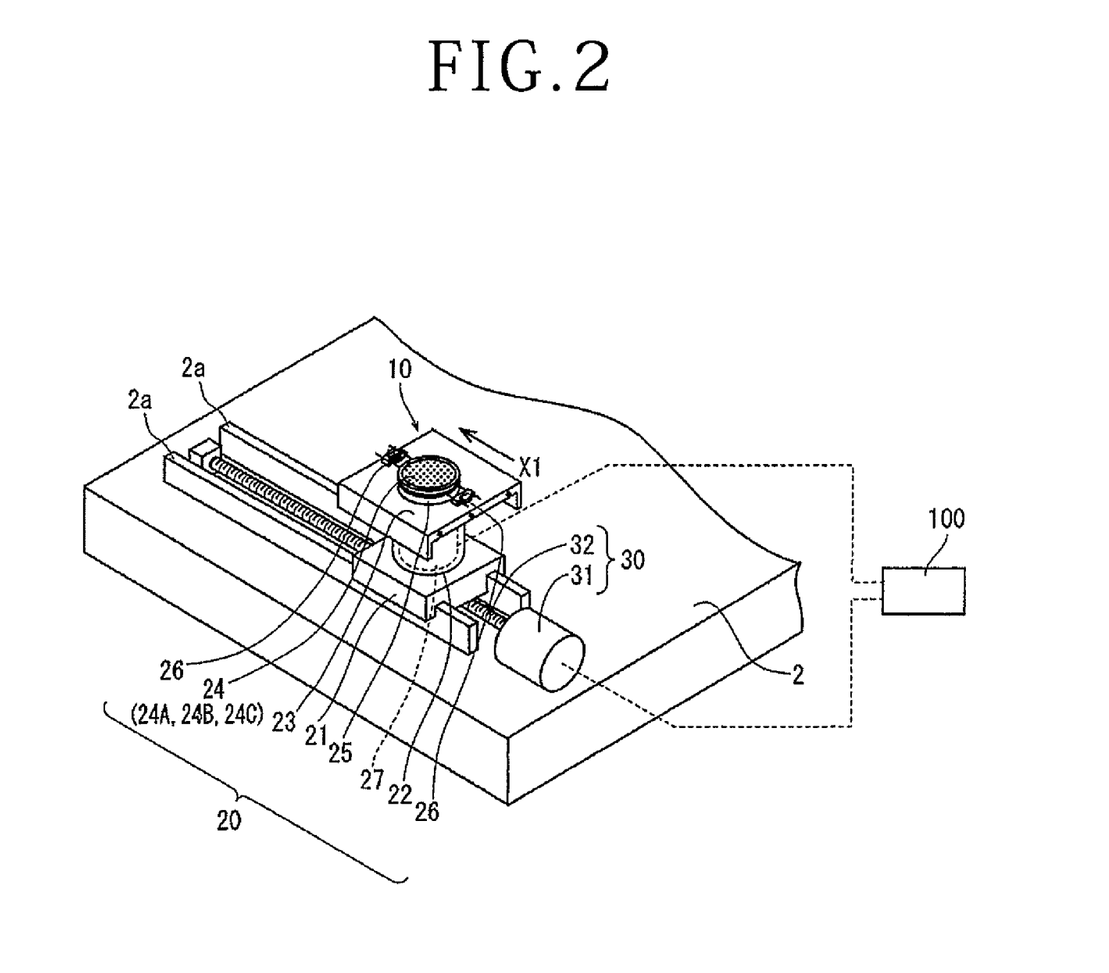
FIG. 2 is an enlarged perspective view of a table mechanism included in the dicing apparatus depicted in FIG. 1.

The table mechanism 10 of the dicing apparatus 1 will now be described in more detail with reference to FIGS. 1, 2, and 3A to 3C. FIG. 2 is an enlarged perspective view of the table mechanism 10 stored in the housing 1A and provided on a stationary base 2. As depicted in FIG. 2, the table mechanism 10 includes a holding unit 20 for holding the wafer W as a workpiece under suction and a feeding mechanism 30 for feeding the holding unit 20 in the X1 direction depicted by an arrow X1 in processing the wafer W.

The holding unit 20 includes a rectangular X movable plate 21 mounted on the stationary base 2 so as to be movable in the X1 direction, a solid cylindrical base 25 for detachably supporting the chuck table 24, and a rectangular cover plate 23 surrounding the outer circumference of the base 25. The base 25 is provided with a rotational drive portion 22 and a pair of clamp mechanisms 26 (see also FIG. 3C). The rotational drive portion 22 is mounted on the X movable plate 21 and functions to rotationally drive the chuck table 24 with the base 25. The clamp mechanisms 26 are provided between the upper surface of the base 25 and the chuck table 24 and function to support the ring frame F according to the size of the ring frame F supporting the wafer W. The rotational drive portion 22 includes a rotational drive source 27 for rotating the chuck table 24 with the base 25. For example, the rotational drive source 27 is configured by a pulse (stepping) motor capable of being precisely controlled in rotational speed and rotational position.

The feeding mechanism 30 includes a drive source 31 for providing a rotary motion and a ball screw 32 connected to the drive source 31 for converting the rotary motion into a linear motion. The ball screw 32 is threadedly engaged with an internal threaded portion (not depicted) formed in the X movable plate 21, thereby transmitting the linear motion to the internal threaded portion of the X movable plate 21. Accordingly, when the ball screw 32 is rotated by the drive source 31, the X movable plate 21 is linearly moved in the X1 direction along a pair of guide rails 2a provided on the base 2. That is, the X movable plate 21 is slidably mounted on the guide rails 2a extending in the X1 direction. For example, the drive source 31 is configured by a pulse (stepping) motor capable of being precisely controlled in rotational speed and rotational position.

As depicted in FIG. 2, the rotational drive source 27 and the drive source 31 are connected to a control unit 100. The control unit 100 is configured by a computer, which includes a central processing unit (CPU) for computing according to a control program, a read only memory (ROM) previously storing the control program, a random access memory (RAM) for temporarily storing detected values, computation results, etc., an input interface, and an output interface (these elements being not depicted). The rotational drive source 27 and the drive source 31 are controlled by the control unit 100 according to rotating conditions and feeding conditions optionally set in the control unit 100. More specifically, the rotational drive source 27 and the drive source 31 are controlled by the frequencies of pulse signals set according to the rotating conditions and the feeding conditions. Although not depicted, position detectors are provided in relation to the X movable plate 21 and the base 25, respectively. That is, the X position of the chuck table 24 in the X1 direction and the rotational position along the outer circumference of the chuck table 24 can be accurately detected by these position detectors. Detection signals from these position detectors are input into the control unit 100, and the rotational drive source 27 of the base 25 and the drive source 31 of the feeding mechanism 30 are controlled according to the pulse signals output from the control unit 100. Accordingly, in feeding the chuck table 24 in the X1 direction, the chuck table 24 can be moved to a desired position at acceleration and a uniform speed included in the feeding conditions. Similarly, in rotating the chuck table 24, the chuck table 24 can be rotated to a desired rotational position (angular position) at a rotational acceleration and a rotational speed included in the rotating conditions.

Figure 3A:
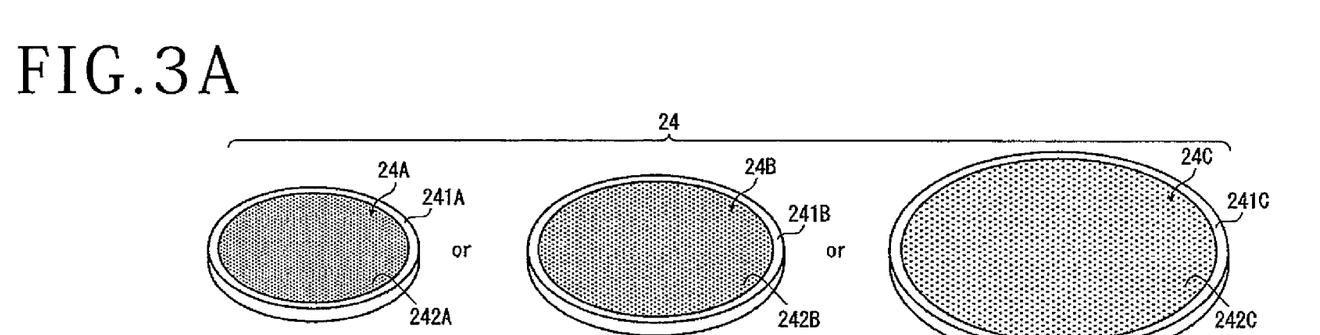
FIG. 3A is a perspective view depicting a plurality of kinds of chuck tables adapted to be selectively used in the dicing apparatus 1.
Figures 3B, 3C:
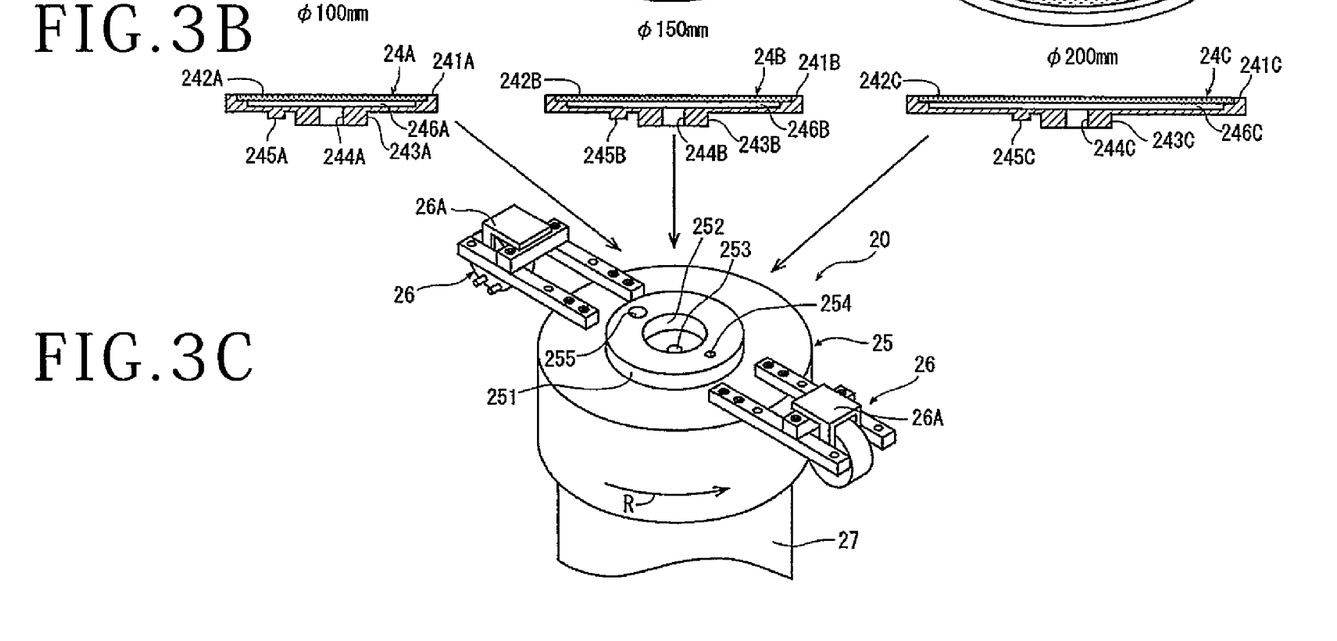
FIG. 3B is a sectional view of the plural kinds of chuck table depicted in FIG. 3A.
FIG. 3C is a perspective view of a base for supporting the chuck table selected from the plural kinds of chuck tables depicted in FIG. 3A.

FIG. 3A is a perspective view depicting a plurality of kinds of chuck tables 24 (24A, 24B, and 24C) adapted to be selectively used in the dicing apparatus 1. FIG. 3B is a sectional view of the plural kinds of chuck tables 24 (24A, 24B, and 24C) depicted in FIG. 3A. FIG. 3C is a perspective view of the base 25. The base 25 is adapted to detachably support each chuck table 24. That is, one of the plural kinds of chuck tables 24A, 24B, and 24C having different sizes is selected according to the size of the workpiece (wafer W) and this selected chuck table 24 can be detachably mounted on the base 25. For example, the chuck table 24A is a chuck table for holding a 4-inch size wafer and has a diameter of 100 mm. The chuck table 24B is a chuck table for holding a 6-inch size wafer and has a diameter of 150 mm. The chuck table 24C is a chuck table for holding an 8-inch size wafer and has a diameter of 200 mm. In the case of using the chuck table 24B as a typical example, the configuration of the table mechanism 10 including the chuck table 24 and the base 25 will now be described in more detail with reference to FIGS. 3A to 3C and 4.

As depicted in FIGS. 3A to 3C and 4, the chuck table 24B includes a vacuum chuck 242B forming an upper surface as a holding surface for holding the wafer W and a peripheral frame 241B surrounding the vacuum chuck 242B so as to support the same. The vacuum chuck 242B is formed of porous ceramic having air permeability. The height of the upper surface of the vacuum chuck 242B is the same as the height of the upper surface of the peripheral frame 241B. That is, the upper surface of the vacuum chuck 242B is flush with the upper surface of the peripheral frame 241B. The peripheral frame 241B is formed of ceramic having no air permeability. A circular projection 243B is formed on the lower surface of the peripheral frame 241B at its central portion. A positioning cylindrical small projection 245B is formed on the lower surface of the peripheral frame 241B at a position near the circular projection 243B. A space 246B is defined between the lower surface of the vacuum chuck 242B and the peripheral frame 241B. That is, the upper surface of the peripheral frame 241B at its central portion is formed with a circular recess forming the space 246B. A suction vacuum is adapted to be applied to this space 246B. Further, a suction passage 244B is formed in the circular projection 243B at its central portion so as to communicate with the space 246B.

The base 25 includes a table holding member 251 for holding the chuck table 24B and two clamp mechanisms 26 provided so as to be opposed to each other with the table holding member 251 interposed therebetween. That is, the base 25 has an upper surface, and the table holding member 251 projects from the upper surface of the base 25 at its central portion. The two clamp mechanisms 26 are mounted on the upper surface of the base 25 in its peripheral portion surrounding the table holding member 251. Each clamp mechanism 26 has a gripping member 26A for gripping the ring frame F supporting the wafer W, in which the position of the gripping member 26A is changeable according to the size of the ring frame F supporting the wafer W.

Figure 4:
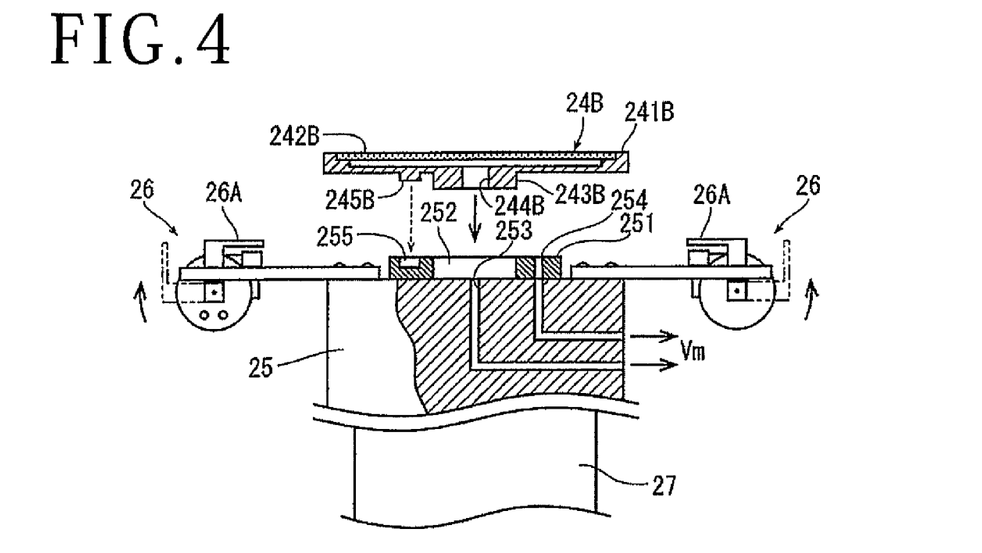
FIG. 4 is a partially sectional side view depicting a holding unit including the base and the chuck table selected as depicted in FIGS. 3A to 3C.

The table holding member 251 is a cylindrical member having an outer diameter smaller than the diameter of the base 25 (e.g., the outer diameter of the table holding member 251 is approximately ½ of the diameter of the base 25). A circular recess (through hole) 252 is formed in the table holding member 251 at its central portion. The circular recess 252 has a diameter slightly larger than the outer diameter of the circular projection 243B of the chuck table 24B, so that the circular projection 243B can be fitted into the circular recess 252. As depicted in FIG. 4, the bottom of the circular recess 252 is connected at its center through a wafer suction passage 253 to a vacuum source (not depicted). That is, the wafer suction passage 253 is formed in the base 25 so that when the circular projection 243B of the chuck table 24B is fitted in the circular recess 252 of the table holding member 251 (the base 25), a vacuum Vm produced by the vacuum source is applied through the wafer suction passage 253 to the vacuum chuck 242B, thereby sucking the wafer W. Further, a chuck table suction passage 254 is also formed in the base 25 so as to be connected to the vacuum source.

Further, as depicted in FIG. 4, when the circular projection 243B of the chuck table 24B is fitted in the circular recess 252 of the table holding member 251, the lower surface of the chuck table 24B in a peripheral area surrounding the circular projection 243B comes into contact with the upper surface of the table holding member 251 around the circular recess 252. The chuck table suction passage 254 is open to the upper surface of the table holding member 251, so that the vacuum Vm is applied through the chuck table suction passage 254 to the lower surface of the chuck table 24B, thereby sucking the chuck table 24B. Further, a positioning recess 255 is formed on the upper surface of the table holding member 251. The positioning recess 255 is adapted to engage with the projection 245B formed on the lower surface of the peripheral frame 241B of the chuck table 24B. Accordingly, when the circular projection 243B of the chuck table 24B is fitted into the circular recess 252 of the table holding member 251 and the projection 245B of the chuck table 24B is also engaged with the positioning recess 255 of the table holding member 251, the circumferential position of the chuck table 24B with respect to the base 25 can be fixed in holding the chuck table 24B on the base 25 under suction. Further, relative rotation of the chuck table 24B with respect to the base 25 can be restricted, so that the rotation of the base 25 can be reliably transmitted to the chuck table 24B.

As described above, the chuck table 24B having a diameter of 150 mm according to the 6-inch size wafer W is used as a typical example of the chuck table 24 to describe the configuration of the chuck table 24 and the base 25. As depicted in FIGS. 3A and 3B, the chuck table 24A according to the 4-inch size wafer W has a peripheral frame 241A and a vacuum chuck 242A respectively different in diameter from the peripheral frame 241B and the vacuum chuck 242B of the chuck table 24B. Similarly, the chuck table 24C according to the 8-inch size wafer W has a peripheral frame 241C and a vacuum chuck 242C respectively different in diameter from the peripheral frame 241B and the vacuum chuck 242B of the chuck table 24B. The other configurations of the chuck tables 24A and 24C are the same as the other configuration of the chuck table 24B. Accordingly, the description of the other chuck tables 24A and 24C will be omitted.

The operation of the dicing apparatus 1 having the above configuration will now be described. One of the plural wafers W stored in the cassette 4A is taken out by the handling mechanism 3 and transferred to the temporary setting table 5. Thereafter, the wafer W is transferred to the holding unit 20 by the first transfer mechanism 6. The wafer W placed on the chuck table 24 is held under suction on the chuck table 24 by operating the vacuum source. Thereafter, the chuck table 24 is moved in the X direction to a position directly below the alignment unit 11 having the imaging unit (camera) by operating the feeding mechanism 30. At this position, the alignment unit 11 is operated to perform an alignment step of making the alignment between the cutting blade of the cutting unit 12 and a target one of the division lines of the wafer W. After performing the alignment step, the chuck table 24 is further moved in the X direction to a position (cutting area) directly below the cutting unit 12 by operating the feeding mechanism 30. According to the predetermined control program stored in the control unit 100 (see FIG. 2), the cutting unit 12 is operated to cut the wafer W along the target division line extending in a first direction parallel to the X direction. After cutting the wafer W along the target division line, the cutting unit 12 is indexed in the Y direction depicted by an arrow Y, so that the cutting blade is aligned with the next division line extending in the first direction. Thereafter, the wafer W is similarly cut along this next division line. Thereafter, the indexing operation and the feeding operation are similarly repeated to cut the wafer W along all the other division lines extending in the first direction. Thereafter, the rotational drive source 27 of the rotational drive portion 22 is operated to rotate the chuck table 24 by 90 degrees, so that the other division lines extending in a second direction perpendicular to the first direction become parallel to the X direction. Thereafter, the feeding operation and the indexing operation are similarly repeated to cut the wafer W along all the other division lines extending in the second direction. As a result, the wafer W is divided into a plurality of individual chips. Thereafter, the chuck table 24 is moved back to the standby position depicted in FIG. 1, and the wafer W is transferred to the cleaning unit 8 by the second transfer mechanism 13. After cleaning the wafer W in the cleaning unit 8, the wafer W is transferred to the temporary setting table 5 by the first transfer mechanism 6. Thereafter, the wafer W is stored again into the cassette 4A by the handling mechanism 3. The function and operation to be realized by this preferred embodiment will now be described in more detail.

Prior to performing the cutting operation in the dicing apparatus 1, the operator selects one of the plural chuck tables 24 having different sizes according to the size and shape of the workpiece to be processed in this cutting operation. For example, in the case of cutting the 8-inch size wafer W, the chuck table 24C having a diameter of 200 mm according to the 8-inch size wafer W is selected. Then, this selected chuck table 24C is set on the base 25. After setting the chuck table 24C on the base 25, the vacuum source (not depicted) is operated to hold the chuck table 24C on the base 25 under suction. Thus, the chuck table 24C is fixed to the base 25.

Figure 5:
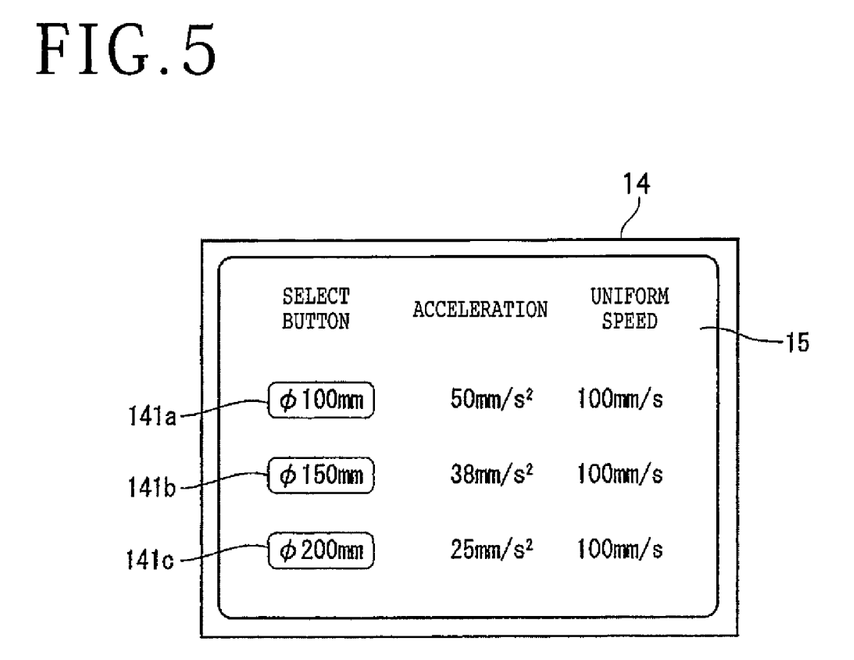
FIG. 5 is an elevational view of a display unit in the condition where a chuck table selecting screen is displayed.

After fixing the chuck table 24C to the base 25, the operator operates the display unit 14 to display a chuck table selecting screen 15 as depicted in FIG. 5. The chuck table selecting screen 15 displays a select button 141a corresponding to the chuck table 24A, a select button 141b corresponding to the chuck table 24B, and a select button 141c corresponding to the chuck table 24C. Further, the chuck table selecting screen 15 also depicts acceleration of the holding unit 20 as a part of the feeding conditions in the case of selecting each select button and a uniform speed of the holding unit 20 to be maintained in cutting the wafer W. The operator touches the select button 141c (ϕ200 mm) corresponding to the chuck table 24C on the chuck table selecting screen 15 of the display unit 14, thereby selecting the select button 141c. According to this selection, the control unit 100 sets the feeding conditions (for example, acceleration: 25 mm/s$^2$, uniform speed: 100 mm/s) corresponding to the chuck table 24C.

As described above, the drive source 31 constituting the feeding mechanism 30 is configured by a pulse motor. Accordingly, the acceleration and the uniform speed in moving the chuck table 24C of the holding unit 20 by operating the feeding mechanism 30 are realized by the frequency of a pulse signal for operating the drive source 31. A method of setting the feeding conditions will now be described in more detail with reference to FIGS. 3A to 3C, 5, and 6.

As described above with reference to FIGS. 3A to 3C, the diameters of the chuck tables 24A, 24B, and 24C are set to 100 mm, 150 mm, and 200 mm, respectively, and the other basic structures are the same. The upper portion of the chuck table 24A except the positioning projection 245A and the circular projection 243A has a cylindrical shape. Similarly, the upper portion of the chuck table 24B except the positioning projection 245B and the circular projection 243B has a cylindrical shape. Similarly, the upper portion of the chuck table 24C except the positioning projection 245C and the circular projection 243C has a cylindrical shape. The positioning projections 245A, 245B, and 245C have the same size and shape, and the circular projections 243A, 243B, and 243C have the same size and shape. In this case, the weight of the upper portion of each chuck table is almost proportional to the square of the radius of each chuck table. For example, when the weight of the upper portion of the chuck portion 24A is S, the weight of the upper portion of the chuck table 24B is approximately 2.25 S, and the weight of the upper portion of the chuck table 24C is approximately 4 S.

Figure 6:
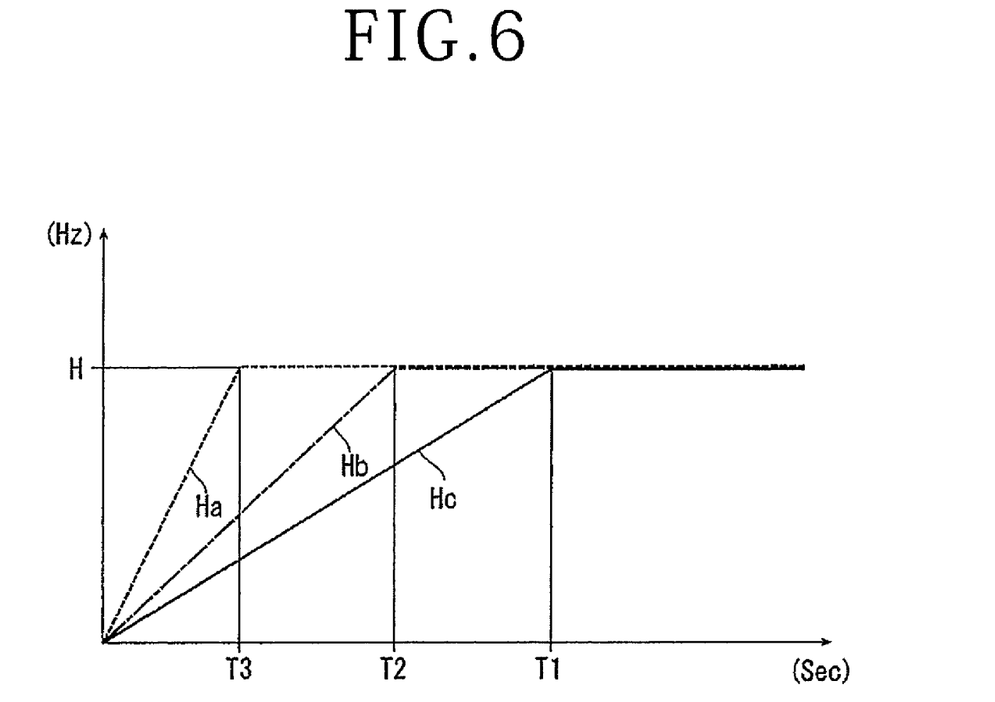
FIG. 6 is a graph depicting a frequency to be set according to the kind of the chuck table, this graph being previously set in a control unit included in the dicing apparatus.

In this preferred embodiment, the feeding conditions are set according to the kind of each chuck table 24, so as to prevent excess load on the feeding mechanism 30. Accordingly, the frequency Ha, Hb, or Hc for controlling the drive source 31 is suitably selected to realize the feeding conditions for each chuck table 24 as depicted in FIG. 6. FIG. 6 is a graph depicting the frequencies Ha, Hb, and Hc. In the graph depicted in FIG. 6, the vertical axis represents the frequency (Hz) of the pulse signal for operating the drive source 31, and the horizontal axis represents elapsed time (sec). The slopes of the lines depicting the frequencies Ha, Hb, and Hc in FIG. 6 correspond to different values for the acceleration in moving the holding unit 20.

In the case of selecting the heaviest chuck table 24C according to the size of the wafer W to be processed by the dicing apparatus 1, the time period from the time of starting the movement of the holding unit 20 to the time the uniform speed (100 mm/s) suitable for cutting is reached is defined as an allowable time period T1. That is, the time period from the time of starting the movement of the holding unit 20 to the time the frequency of the pulse signal for operating the drive source 31 reaches a target frequency H is defined as the allowable time period T1. In this case, the frequency Hc corresponding to the allowable time period T1 is selected as the frequency corresponding to the chuck table 24C, and the acceleration included in the feeding conditions is produced according to the allowable time period T1 and the target frequency H.

The allowable time period T1 mentioned above corresponds to the case of selecting the chuck table 24C. In the case that the target frequency H is reached in a time period shorter than the allowable time period T1, that is, in the case that the acceleration is excessive, excess load may be applied to the feeding mechanism 30, causing a possibility of trouble. Thus, the allowable time period T1 is previously set by an experiment or the like on the basis of the time period causing the possibility of trouble. In this preferred embodiment, the holding unit 20 is accelerated during the allowable time period T1 until the target frequency H is reached. When the target frequency H is reached, the holding unit 20 is moved at a uniform speed of 100 mm/s to a predetermined position. Although not depicted, when the holding unit 20 is moved to this predetermined position, the holding unit 20 starts to be decelerated. Also in decelerating the holding unit 20, the holding unit 20 is decelerated at a predetermined deceleration so as to prevent excess load on the feeding mechanism 30 until stopping at a predetermined stop position. In this manner, in the case of selecting the chuck table 24C, the drive source 31 is operated at the frequency Hc such that the target frequency H is reached in the allowable time period T1.

Accordingly, the acceleration (25 mm/s$^2$) included in the feeding conditions is produced, and when the allowable time period T1 has elapsed, the holding unit 20 is fed at a predetermined uniform speed (100 mm/s). As a result, excess load on the feeding mechanism 30 can be prevented.

In the case of selecting the chuck table 24B lighter than the chuck table 24C according to the size of the wafer W to be processed by the dicing apparatus 1 and then mounting the chuck table 24B on the base 25, the operator touches the select button 141b (φ150 mm) corresponding to the chuck table 24B on the chuck table selecting screen 15 (see FIG. 5) of the display unit 14, thereby selecting the select button 141b. Accordingly, the time period from the time of starting the movement of the holding unit 20 to the time the uniform speed (100 mm/s) suitable for cutting is reached is defined as an allowable time period T2 shorter than the allowable time period T1 mentioned above. That is, the time period from the time of starting the movement of the holding unit 20 to the time the frequency of the pulse signal for operating the drive source 31 reaches the target frequency H is defined as the allowable time period T2. In this case, the frequency Hb corresponding to the allowable time period T2 is set as the frequency corresponding to the chuck table 24B, and the acceleration (38 mm/s$^2$) included in the feeding conditions is produced according to the allowable time period T2 and the target frequency H.

The allowable time period T2 corresponds to the case of selecting the chuck table 24B. In the case that the target frequency H is reached in a time period shorter than the allowable time period T2, excess load may be applied to the feeding mechanism 30. Thus, the allowable time period T2 is previously set by an experiment or the like on the basis of the time period causing the excess load on the feeding mechanism 30. After the allowable time period T2 has elapsed, the holding unit 20 is moved at the uniform speed of 100 mm/s to a predetermined position. Although not depicted, when the holding unit 20 is moved to this predetermined position, the holding unit 20 starts to be decelerated. At this time, the holding unit 20 is decelerated at a predetermined deceleration so as to prevent excess load on the feeding mechanism 30 until stopping at a predetermined stop position. Accordingly, as compared with the case of selecting the chuck table 24C, the acceleration can be made larger in the case of selecting the chuck table 24B, so that the cutting operation for the wafer W can be performed in a shorter time period, and excess load on the feeding mechanism 30 can also be prevented.

In the case of selecting the chuck table 24A lighter than the chuck table 24B according to the size of the wafer W to be processed by the dicing apparatus 1 and then mounting the chuck table 24A on the base 25, the operator touches the select button 141a (φ100 mm) corresponding to the chuck table 24A on the chuck table selecting screen 15 (see FIG. 5) of the display unit 14, thereby selecting the select button 141a. Accordingly, the time period from the time of starting the movement of the holding unit 20 to the time the uniform speed (100 mm/s) suitable for cutting is reached is defined as an allowable time period T3 shorter than the allowable time period T2 mentioned above. That is, the time period from the time of starting the movement of the holding unit 20 to the time the frequency of the pulse signal for operating the drive source 31 reaches the target frequency H is defined as the allowable time period T3. In this case, the frequency Ha corresponding to the allowable time period T3 is set as the frequency corresponding to the chuck table 24A, and the acceleration (50 mm/s$^2$) included in the feeding conditions is produced according to the allowable time period T3 and the target frequency H.

The allowable time period T3 corresponds to the case of selecting the chuck table 24A. In the case that the target frequency H is reached in a time period shorter than the allowable time period T3, excess load may be applied to the feeding mechanism 30. Thus, the allowable time period T3 is previously set by an experiment or the like on the basis of the time period causing the excess load on the feeding mechanism 30. After the allowable time period T3 has elapsed, the holding unit 20 is moved at the uniform speed of 100 mm/s to a predetermined position. Although not depicted, when the holding unit 20 is moved to this predetermined position, the holding unit 20 starts to be decelerated. At this time, the holding unit 20 is decelerated at a predetermined deceleration so as to prevent excess load on the feeding mechanism 30 until stopping at a predetermined stop position. Accordingly, as compared with the case of selecting the chuck table 24B, the acceleration can be made larger in the case of selecting the chuck table 24A, so that the cutting operation for the wafer W can be performed in a shorter time period, and excess load on the feeding mechanism 30 can also be prevented.

According to the above preferred embodiment, the feeding mechanism 30 can be controlled under the feeding conditions including a suitable acceleration according to the kind of the chuck table 24. Accordingly, excess load on the feeding mechanism 30 can be prevented and the productivity can also be improved.

As described above, the dicing apparatus 1 includes the rotational drive portion 22 for rotating the chuck table 24 in cutting the wafer W along the division lines. In this preferred embodiment, in the case of selecting the chuck table 24 according to the size of the workpiece (wafer W), the rotating conditions including a rotational acceleration are set according to the size of the chuck table 24, and the rotational drive portion 22 is controlled under the rotating conditions including the rotational acceleration set above.

More specifically, the control unit 100 controls the rotational drive source 27 constituting the rotational drive portion 22. In controlling the rotational drive source 27, the frequency of a pulse signal for operating the rotational drive source 27 such as a pulse motor is set according to the size of the chuck table 24. The time period from the time of starting the operation of the rotational drive source 27 to the time the rotational speed of the rotational source 27 becomes a target speed is defined as an allowable time period in which a target frequency is reached. A frequency corresponding to the allowable time period is set as the frequency according to the size of the chuck table 24, and the rotational acceleration included in the rotating conditions is produced according to the allowable time period and the target frequency.

As similar to the feeding conditions to be set in controlling the drive source 31 for driving the feeding mechanism 30, the allowable time period corresponds to the case of selecting the chuck table 24 according to the size of the wafer W. In the case that the target frequency is reached in a time period shorter than the allowable time period, excess load may be applied to the rotational drive portion 22 to cause a possibility of trouble or the like. Thus, the allowable time period is previously set by an experiment or the like on the basis of the time period causing the possibility of trouble.

Also in the case of setting the frequency for controlling the rotational drive source 27, the frequency can be set substantially in accordance with the graph depicted in FIG. 6. That is, in the case that the weight of the chuck table 24 selected is relatively large, the time period (allowable time period) in which the target frequency corresponding to a predetermined target rotational speed is reached is made longer, so that the rotational acceleration is set to a smaller value. Conversely, in the case that the weight of the chuck table 24 selected is relatively small, the time period (allowable time period) in which the target frequency corresponding to the predetermined rotational speed is reached is made shorter, so that the rotational acceleration is set to a larger value. Accordingly, excess load on the rotational drive portion 22 can be prevented and the productivity can also be further improved.

The present invention is not limited to the above preferred embodiment, and various modifications may be made. In the above preferred embodiment, the operator selects one of the chuck tables 24 (24A, 24B, and 24C) and mounts the selected chuck table 24 on the base 25. At this time, the operator touches one of the select buttons 141a, 141b, and 141c on the chuck table selecting screen 15 of the display unit 14 according to the chuck table 14 selected, and the feeding conditions are set according to the chuck table 24 selected (according to the kind of the chuck table 24). Then, the feeding mechanism 30 is controlled under the feeding conditions set above. The present invention is not limited to such a configuration. For example, by using a self setting function to be realized by the control program stored in the control unit 100 of the dicing apparatus 1, the feeding conditions including the acceleration of the feeding mechanism 30 may be set. This self setting function will now be described in more detail.

The self setting function is performed after mounting the chuck table 24 on the base 25 according to the size of the wafer W to be processed but before performing the cutting operation for the wafer W stored in the cassette 4A. In performing the self setting function, the operator first selects the chuck table 24 according to the size of the wafer W and then mounts the selected chuck table 24 on the base 25. Thereafter, the feeding mechanism 30 is operated in the condition where the wafer W is not mounted on the chuck table 24, thereby moving the holding unit 20 from the standby area where the wafer W is loaded to the chuck table 24 before cutting and the wafer W is unloaded from the chuck table 24 after cutting (i.e., the area where the holding unit 20 is initially located as depicted in FIG. 1) toward the cutting area where the wafer W held on the chuck table 24 is cut by the cutting unit 12 (idle feeding). In this idle feeding, the target frequency for operating the drive source 31 may be set to a predetermined frequency for moving the holding unit 20 at a uniform speed of 100 mm/s. When the idle feeding is performed to start the movement of the holding unit 20 from the standby area, the frequency for operating the drive source 31 does not reach the predetermined frequency at once, and the holding unit 20 is gradually accelerated until the frequency reaches the predetermined frequency corresponding to the uniform speed of 100 mm/s. At this time, the control unit 100 measures the time period from the time of starting the movement of the holding unit 20 to the time the frequency reaches the predetermined frequency. This time period is long when the weight of the chuck table 24 is large, whereas this time period is short when the weight of the chuck table 24 is small. That is, this time period depends on the kind (weight) of the chuck table 24. In this respect, the control unit 100 adds a predetermined time period to the above time period measured in the idle feeding, thereby setting an allowable time period in which no excess load is applied to the feeding mechanism 30. That is, this allowable time period is equal to the sum of the above measured time period and the predetermined time period. Then, according to this allowable time period, the acceleration of the feeding mechanism 30 is set according to the kind of the chuck table 24 mounted on the base 25. With this configuration, the operator is not required to select one of the select buttons 141a, 141b, and 141c on the chuck table selecting screen 15, and the control unit 100 of the dicing apparatus 1 can realize the self setting function for setting the feeding conditions including the acceleration of the feeding mechanism 30 according to the chuck table 24 mounted on the base 25. According to this self setting function, it is unnecessary to previously record into the control unit 100 the acceleration included in the feeding conditions according to the kind of the chuck table 24 to be used. Accordingly, suitable feeding conditions can be set also in the case of using any unknown chuck table.

The self setting function mentioned above is not limited to the case of setting the feeding conditions including the acceleration of the feeding mechanism 30, and is applicable also to the case of setting the rotating conditions including the rotational acceleration of the rotational drive portion 22. More specifically, the operator first selects the chuck table 24 according to the size of the wafer W and then mounts the selected chuck table 24 on the base 25. Thereafter, the rotational drive source 27 of the rotational drive portion 22 is operated in the condition where the wafer W is not mounted on the chuck table 24, thereby rotating the chuck table 24 by a predetermined angle, e.g., by 90 degrees (idle rotation). In this idle rotation, the target frequency for operating the rotational drive source 27 may be set to a predetermined frequency for rotating the chuck table 24 at a predetermined target rotational speed. When the idle rotation is performed to start the rotation of the chuck table 24, the frequency for operating the rotational drive source 27 does not reach the predetermined frequency at once, but the chuck table 24 is gradually accelerated in rotation until the frequency reaches the predetermined frequency corresponding to the predetermined target rotational speed. At this time, the control unit 100 measures the time period from the time of starting the rotation of the chuck table 24 to the time the frequency reaches the predetermined frequency. This time period is long when the weight of the chuck table 24 is large, whereas this time period is short when the weight of the chuck table 24 is small. That is, this time period depends on the kind (weight) of the chuck table 24. In this respect, the control unit 100 adds a predetermined time period to the above time period measured in the idle rotation, thereby setting an allowable time period in which no excess load is applied to the rotational drive portion 22. That is, this allowable time period is equal to the sum of the above measured time period and the predetermined time period. Then, according to this allowable time period, the rotational acceleration of the rotational drive portion 22 is set according to the kind of the chuck table 24 mounted on the base 25. With this configuration, the operator does not require to select one of the select buttons 141a to 141c on the chuck table selecting screen 15, but the control unit 100 of the dicing apparatus 1 can set the rotating conditions including the rotational acceleration of the rotational drive portion 22 according to the chuck table 24 mounted on the base 25.

In the above preferred embodiment, the workpiece is a circular wafer W, and the chuck table 24 is so configured as to hold the circular wafer W. However, the present invention is applicable also to the case that the workpiece is a rectangular CSP and the chuck table 24 is a chuck table (holding jig) for holding the rectangular CSP. In the case that the weight of this chuck table is different according to the size or shape of the CSP as a workpiece to be processed, the feeding conditions and the rotating conditions may be set according to the chuck table to be selected according to the workpiece. Then, the drive source of the feeding mechanism may be controlled under the feeding conditions set above, and the rotational drive source of the rotational drive portion may be controlled under the rotating conditions set above.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
   a holding unit holding a workpiece;
   a processing unit processing said workpiece held by said holding unit;
   a feeding mechanism for feeding said holding unit; and
   a control unit controlling said feeding mechanism, wherein:
      said holding unit has a chuck table for holding said workpiece and a base for detachably supporting said chuck table,
      said chuck table includes a plurality of kinds of chuck tables, one of which being selected according to the size or shape of said workpiece, said base being capable of mounting said chuck table selected from said plurality of kinds of chuck tables, and
      after said chuck table mounted on said base is selected, said control unit sets feeding conditions including acceleration of said feeding mechanism according to the kind of said chuck table mounted on said base and controls said feeding mechanism under said feeding conditions according to said chuck table, and
   wherein the control unit includes a plurality of sets of feeding conditions stored therein, with one of said sets of feeding conditions being associated with each of said different kinds of chuck tables, and further wherein said feeding conditions set by said control unit are selected from among said sets of feeding conditions stored in said control unit.

2. The processing apparatus according to claim 1, wherein said base of said holding unit is provided with a rotational drive portion for rotating said chuck table, and after said chuck table mounted on said base is selected, said control unit sets rotating conditions including a rotational acceleration of said rotational drive portion according to the kind of said chuck table mounted on said base and controls said rotational drive portion under said rotating conditions according to said chuck table.

3. The processing apparatus according to claim 2, wherein said control unit sets a frequency for controlling a rotational drive source constituting said rotational drive portion and produces said rotational acceleration included in said rotating conditions by setting an allowable time period from the time of starting the operation of said rotational drive source to the time the frequency set above reaches a target frequency, according to the kind of said chuck table.

4. The processing apparatus according to claim 1, wherein said plurality of kinds of chuck tables differ from each other by weight.

5. A processing apparatus comprising:
   a holding unit holding a workpiece;
   a processing unit processing said workpiece held by said holding unit;
   a feeding mechanism for feeding said holding unit; and
   a control unit controlling said feeding mechanism, wherein:
      said holding unit has a chuck table for holding said workpiece and a base for detachably supporting said chuck table,
      said chuck table includes a plurality of kinds of chuck tables, one of which being selected according to the size or shape of said workpiece, said base being capable of mounting said chuck table selected from said plurality of kinds of chuck tables, and
      after said chuck table mounted on said base is selected, said control unit sets feeding conditions including acceleration of said feeding mechanism according to the kind of said chuck table mounted on said base and controls said feeding mechanism under said feeding conditions according to said chuck table,
   wherein said control unit sets a frequency for controlling a drive source constituting said feeding mechanism and produces said acceleration included in said feeding conditions by setting an allowable time period from the time of starting the operation of said drive source to the time the frequency set above reaches a target frequency, according to the kind of said chuck table, which results in said control unit setting different accelerations for different kinds of chuck tables.

6. The processing apparatus according to claim 5, wherein said plurality of kinds of chuck tables differ from each other by weight.

7. A processing apparatus comprising:
   a holding unit holding a workpiece;
   a processing unit processing said workpiece held by said holding unit;
   a feeding mechanism for feeding said holding unit; and
   a control unit controlling said feeding mechanism, wherein:
      said holding unit has a chuck table for holding said workpiece and a base for detachably supporting said chuck table,
      said chuck table includes a plurality of kinds of chuck tables, one of which being selected according to the size or shape of said workpiece, said base being capable of mounting said chuck table selected from said plurality of kinds of chuck tables, wherein said plurality of kinds of chuck table includes at least a first kind of chuck table and a second kind of chuck table, wherein said first kind of chuck table is different from said second kind of chuck table,
      after said chuck table mounted on said base is selected, said control unit sets feeding conditions including acceleration of said feeding mechanism according to the kind of said chuck table mounted on said base and controls said feeding mechanism under said feeding conditions according to said chuck table, and wherein the control unit includes a plurality of sets of feeding conditions stored therein, including a first set of feeding conditions associated with the first kind of chuck table and a second set of feeding conditions associated with the second kind of chuck table, and further wherein said feeding conditions set by said control unit are selected from among said sets of feeding conditions stored in said control unit.

8. The processing apparatus according to claim 7, wherein said first kind of chuck table is of a first weight and said second kind of chuck table is of a second weight, and further wherein said first weight is different from said second weight.

* * * * *